United States Patent
Roy

(10) Patent No.: US 7,304,264 B2
(45) Date of Patent: Dec. 4, 2007

(54) MICRO THERMAL CHAMBER HAVING PROXIMITY CONTROL TEMPERATURE MANAGEMENT FOR DEVICES UNDER TEST

(75) Inventor: Shambhu N. Roy, Boise, ID (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/822,841

(22) Filed: Apr. 13, 2004

(65) Prior Publication Data
US 2005/0224492 A1 Oct. 13, 2005

(51) Int. Cl.
*B23K 10/00* (2006.01)
(52) U.S. Cl. .......................... 219/121.43; 219/121.54; 219/121.4; 156/345.27; 156/345.52; 118/725
(58) Field of Classification Search .......... 219/121.43, 219/121.4, 121.41, 494, 497, 502, 505, 121.54; 156/345.24, 345.52, 345.53, 345.27; 117/724, 117/725
See application file for complete search history.

(56) References Cited

U.S. PATENT DOCUMENTS

| | | | |
|---|---|---|---|
| 5,821,505 A | 10/1998 | Tustaniwskyj et al. | |
| 5,844,208 A | 12/1998 | Tustaniwskyj et al. | |
| 5,966,940 A | 10/1999 | Gower et al. | |
| 6,002,109 A * | 12/1999 | Johnsgard et al. | 219/390 |
| 6,091,062 A | 7/2000 | Pfahnl et al. | |
| 6,215,106 B1 * | 4/2001 | Boas et al. | 219/390 |
| 6,307,388 B1 | 10/2001 | Friedrich et al. | |
| 6,893,505 B2 * | 5/2005 | Peace | 118/506 |
| 2001/0019899 A1 * | 9/2001 | Rolfson et al. | 438/758 |
| 2004/0051545 A1 | 3/2004 | Tilton et al. | |
| 2004/0060917 A1 * | 4/2004 | Liu et al. | 219/390 |

OTHER PUBLICATIONS http://www.aetrium.com/mdtx32.htm; *Model DTX Series Dynamic Temperature Pick-And-Place IC Test Handler*, pp. 1-4.
http://www.deltad.com/products/autotest/pickplace_summit.htm; *Delta Design Products: Automated Test Handlers: Pick & Place Summit Handler*.
http://www.testandmeasurement.com/Content/ProductShowcase/product.asp?DOCID; *Test and Measurement.Com, Schlumberger introduces IHS 1100 test handler with advanced thermal control*; pp. 1 & 2.
PCT Written Opinion of the International Searching Authority dated Jul. 28, 2005 issued in corresponding PCT Application No. PCT/JP2005/007491.
PCT International Search Report dated Jul. 28, 2005 issued in corresponding PCT Application No. PCT/JP2005007491.

* cited by examiner

*Primary Examiner*—Mark Paschall

(57) ABSTRACT

A temperature unit to control a temperature of a device under test using a fluid includes a block disposed opposite the device under test and which defines a gap therebetween and through which the fluid passes across the device under test at a gap flow rate, and an actuator which moves the block. By adjusting the gap, the gap flow rate of the fluid flowing over the device under test changes so as to adjust the temperature of the device under test. Additionally, the block can be a heater block which generates heat receivable by the device under test across the gap such that the adjustment of the heater block by the actuator changes a thermal resistance across the gap.

26 Claims, 5 Drawing Sheets

MICRO THERMAL CHAMBER HAVING PROXIMITY CONTROL TEMPERATURE MANAGEMENT FOR DEVICES UNDER TEST

BACKGROUND OF THE INVENTION

During the manufacture of semiconductor devices, the manufactured semiconductor devices are subjected to a battery of tests in order to ensure their suitability for use by the ultimate consumer. This testing process is performed using automated testing equipment (ATE). The ATE system is designed to test the devices (usually referred to as devices under test or DUTs) over a wide variety of conditions. The ATE system generally includes a tester, which performs the test on the devices, and a handler, which introduces the devices to and removes the devices from the tester. During the testing process, it is generally preferred to have the devices kept at a pre-determined temperature since the temperature affects the electrical properties of the devices being tested. Further, in order to test the devices at design temperatures to mimic design and operational conditions of the device, the tester needs to test the devices over a range of temperatures. As such, there is a need to control the temperature of the device during the testing process.

One solution used to control the temperature involves placing a heating unit between the device being tested and a liquid cooled heat sink. However, this solution does not allow for rapid response times for heating and cooling. In addition, the heating unit would have to be very thin to prevent an inordinate amount of shielding and interference with the cooling effect of the heat sink. As such, the heating unit needs to have a low thermal mass, which increases costs, and hinders the response times and the use of high wattage.

According to another solution, a liquid is disposed between the heating unit and the device so as to lower the thermal resistance therebetween. However, the liquid itself needs to evaporate after the testing without leaving any residue on the device. Additionally, the liquid needs to have a large temperature range for the testing. Thus, such liquids are difficult to find, making the use of the liquid impractical.

Further, proposed solutions include using thermal electric devices and heat exchangers. However, the thermal electric devices are not useful for high power densities and are unreliable in an industrial environment.

As such, the existing solutions to provide temperature control of a DUT are not able to control wide ranges of temperatures, have a fast response time, and also be stable and easy to control during the testing process.

SUMMARY OF THE INVENTION

It is an aspect of the invention to provide a low cost, robust temperature control unit having rapid response times and which controls a temperature of a device under test by mechanical methods.

It is another aspect of the invention to provide a low cost, robust temperature control unit which controls a temperature of a device under test by mechanically adjusting a thermal resistance and/or a thermal property in a space above the device under test.

Additional aspects and advantages of the invention will be set forth in part in the description which follows and, in part, will be obvious from the description, or may be learned by practice of the invention.

According to an aspect of the invention, a temperature unit to control a temperature of a device under test includes a heater block disposed opposite the device under test and which generates heat receivable by the device under test across a gap, and an actuator which moves the heater block so as to adjust the gap while the heater block generates the heat so as to vary an amount of the heat received at the device under test so as to adjust the temperature of the device under test.

According to another aspect of the invention, the actuator increases the gap so as to increase a thermal resistance between the heater block and the device under test so as to decrease the amount of the heat received at the device under test, and the actuator decreases the gap so as to decrease the thermal resistance between the heater block and the device under test so as to increase the amount of the heat received at the device under test.

According to a further aspect of the invention, the temperature unit further includes a housing which houses the actuator and the heater block and which includes an interface to hold the device under test, wherein the housing is connectable to a handler for use in automated testing equipment.

According to a yet further aspect of the invention, a temperature unit to control a temperature of a device under test using a fluid includes a block disposed opposite the device under test and which defines a gap therebetween and through which the fluid passes over the device under test at a gap flow rate, and an actuator which moves the block so as to adjust the gap and vary the gap flow rate of the fluid flowing over the device under test so as to adjust the temperature of the device under test.

According to a still further aspect of the invention, the block includes a heater block which generates heat receivable by the device under test across the gap.

According to a yet still further aspect of the invention, the temperature unit further includes a passageway through which fluid flows through the temperature unit and a valve which controls an initial flow rate of the fluid introduced into the passageway, where the actuator adjusts the gap so as to vary the gap flow rate from the initial flow rate.

According to an additional aspect of the invention, the temperature unit further includes a passageway through which fluid flows through the temperature unit and a pump which controls an initial flow rate of the fluid introduced into the passageway, where the actuator adjusts the gap so as to vary the gap flow rate from the initial flow rate.

According to a yet additional aspect of the invention, the temperature unit further includes a valve through which the fluid passes between the passageway and the pump, where the valve is closed in order to create a suction force at the gap using the pump.

According to a still additional aspect of the invention, while the suction force is created, the heater block generates the heat so as to adjust the temperature of the device under test.

According to a still yet additional aspect of the invention, a computer readable medium encoded with processing instructions for implementing a method of controlling a temperature of a device under test performed by a computer, the method includes determining actuator and heater block settings required to achieve the temperature required for the device under test, adjusting a heater block to generate heat according to the determined heater block setting, and adjusting the actuator to move the heater block to a distance above the device under test according to the determined actuator setting.

According to a further aspect of the invention, a computer readable medium encoded with processing instructions for implementing a method of controlling a temperature of a device under test within a temperature unit as performed by a computer, the method includes, for an initial flow rate of fluid introduced into the temperature unit, determining an actuator setting required to achieve the temperature required for the device under test, and adjusting the actuator to move a block to a gap above the device under test according to the determined actuator setting so as to vary the initial flow rate to achieve a gap flow rate of the fluid flowing across the device under test which achieves the required temperature.

According to a still further aspect of the invention, the block includes a heater block which generates heat receivable by the device under test across the gap, and the method further includes determining a heater block setting required to achieve the temperature required for the device under test in conjunction with the determined actuator setting, and adjusting the heater block to generate the heat according to the determined heater block setting.

According to a yet still further aspect of the invention, the method further includes detecting a present temperature of the device under test and adjusting one of the heater block and the actuator if the present temperature is not the required temperature.

According to a yet additional aspect of the invention, the determining the actuator and heater block settings includes detecting a present temperature of the device under test and determining the heater block and the actuator settings if the present temperature is not the required temperature.

According to a still yet additional aspect of the invention, the method further includes creating a suction force within the gap by adjusting a valve through which the fluid flows into or out of the temperature unit and controlling a pump which circulates the fluid through the temperature unit.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE EMBODIMENTS

Figure 1:
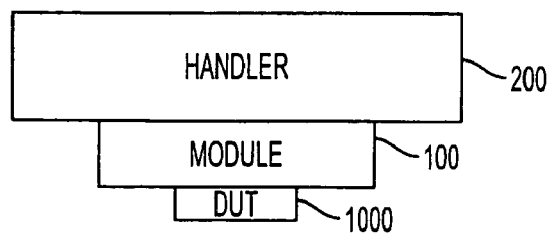
FIG. 1 is a schematic representation of a module in conjunction with a handler according to an embodiment of the invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
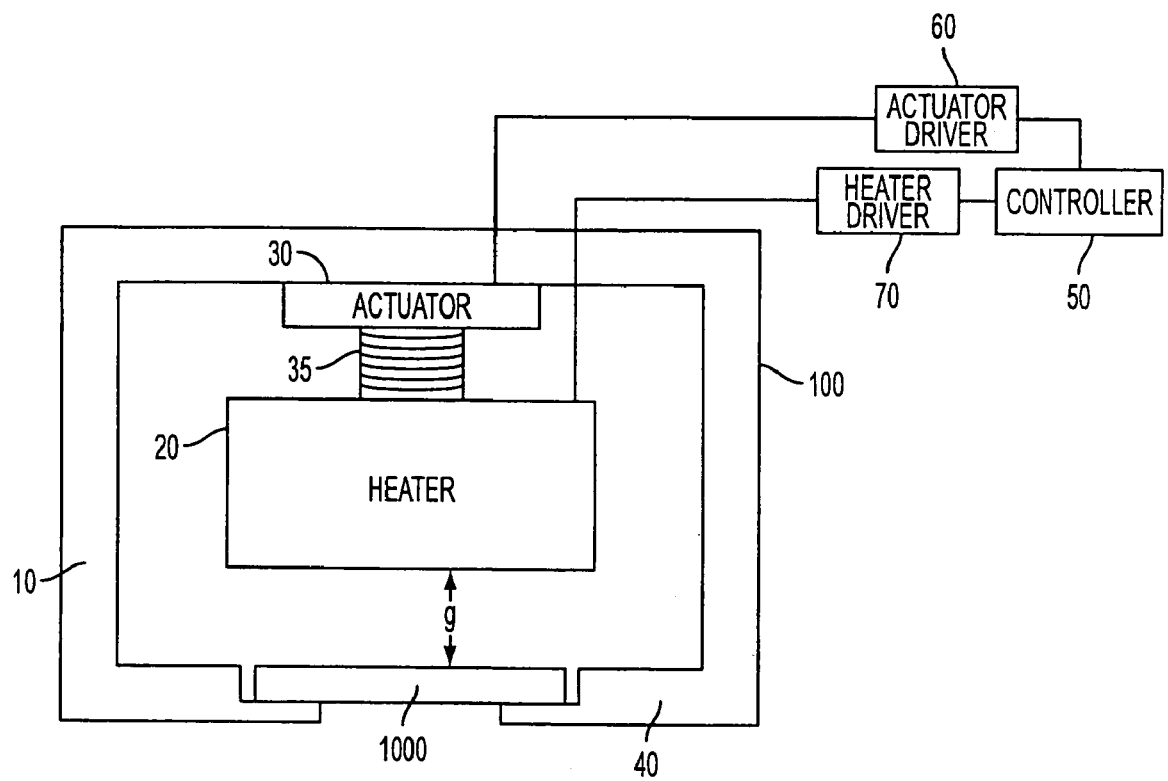
FIG. 2 is a schematic representation of an embodiment of the module of FIG. 1.

FIG. 1 schematically shows an embodiment of the invention in which a module 100 is used with a handler 200. As shown in the embodiment of FIG. 2, the module 100 includes a temperature control unit 10 which holds onto a device under test 1000 using an interface 40 to create a space in which the temperature is controlled. Within the space, a heater block 20 is attached to an actuator 30 so as to be movable relative to the device under test 1000 through the action of the actuator 30. As shown, the actuator 30 is a screw type actuator which has threads 35 which allow precise placement of the heater block 20 above the device under test 1000 so as to control a gap g therebetween. However, it is understood that other types of actuators 30 could be used. Examples of such other types of actuators 30 include, but are not limited to, linear motors, rack and pinion arrangements, and other types of linear motion devices.

The change in the gap g changes the thermal resistance so as to increase or decrease the temperature at the device under test 1000. Specifically, the change in the gap g adjusts the distance between the device under test 1000 and the heater block 20. The gap g imparts a thermal resistance between the device under test 1000 and the heater block 20. Therefore, for a set amount of heat generated by the heater block 20, the temperature achieved at the device under test 1000 varies as a function of the gap g. This variation is generally inversely proportional such that the smaller the gap g, the higher the temperature at the device under test 1000.

A controller 50 drives an actuator driver 60 and a heater driver 70 in order to control the actuator 30 and the heater block 20. Specifically, the controller 50 controls the heater driver 70 so as to bring the heater block 20 to a pre-determined temperature. The controller 50 controls the actuator driver 60 to control the actuator 30 to maneuver the heater block 20 to a pre-determined gap g above the device under test 1000. In this way, the temperature of the device under test 1000 can be controlled both by the heat generated from the heater block 20 and by creating a pre-determined thermal resistance due to the actuator 30 adjusting the gap g between the device under test 1000 and the heater block 20.

The thermal resistance can be defined using appropriate media, such as ambient air, which have predictable thermal behavior and insulative value as a function of distance. However, it is understood that vacuum or near vacuum conditions could also be used to control the thermal resistance therebetween.

According to an aspect of the invention, the controller 50 uses a feedback loop to control the heater driver 70 and the actuator driver 60 to adjust and/or maintain the temperature of the heater block 20 and the gap g. For instance, the feedback loop could use a sensor (not shown) from which the controller 50 determines a present temperature of the device under test 1000. However the present temperature is obtained, by comparing the present temperature with the required temperature for testing, the controller 50 adjusts the heater driver 70 and the actuator driver 60 to achieve the required temperature. As such, it is not required for all aspects of the invention that the controller 50 use pre-calibrated values and settings in order to achieve the temperature at the device under test 1000.

Additionally, it is understood that ones of the settings used by the controller 50 could be pre-calibrated, while the remaining settings are controlled using the feedback loop in order to achieve and maintain a temperature. According to an aspect of the invention, the controller 50 uses pre-calibrated variables as settings to control the temperature of the heater block 20, and uses a feedback loop to control the actuator 30 to adjust the gap "g." However, it is understood that other permutations and combinations can be used.

Figure 3:
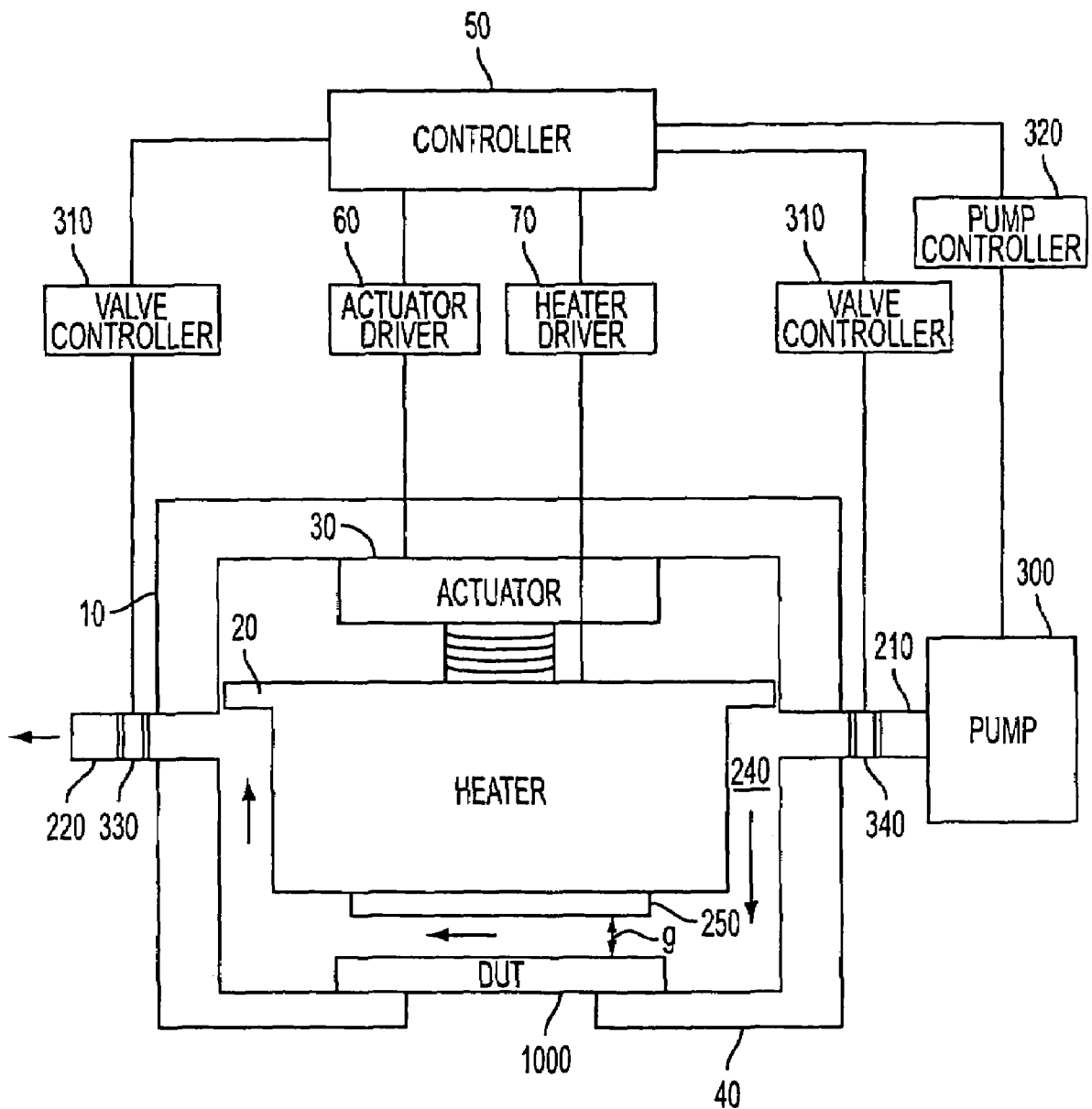
FIG. 3 is a schematic representation of another embodiment of the module of FIG. 1.

According to another embodiment of the module 100 shown in FIG. 3, the module 100 further controls the thermal resistance by introducing a fluid 240. Using a pump 300, the fluid 240 is pumped through an inlet 210. The introduced fluid 240 passes through a passageway between the heater block 20, the interface 40, the temperature control unit 10, and the device under test 1000. The fluid 240 is removed from the module 100 through an outlet 220. In order to additionally control the temperature using the fluid 240, the controller 50 further utilizes a valve controller 310 and a pump controller 320. The valve controller 310 controls the inlet valve 340 and an outlet valve 330 so as to control the flow rate for the fluid 240 through the module 100. The pump controller 320 controls the pump 300 so as to also control the flow rate of the fluid 240 through the module 100. The fluid 240 can be any type of gas or fluid and which is useful for cooling devices as known in the art. Additionally, while the valves 330, 340 can be variable control valves, the valves 330, 340 need not be variable in all aspects of the invention.

By controlling the heater block 20, the temperature of the device under test 1000 can be roughly adjusted. Further, since the thermal resistance between the device under test 1000 and the heater block 20 is generally inversely proportional to the gap g therebetween, the temperature of the device under test 1000 can be more finely controlled using the actuator 30 to adjust the gap g. For instance, when the gap g is zero, the device under test 1000 will be in contact with the heater block 20 and will achieve the hottest temperature possible for a given heater block setting. Conversely, when the gap g is very large, the effect of the heater block 20 will be greatly diminished for the given heater block setting.

By the further introduction of the fluid 240 as shown in FIG. 3, the temperature can be further moderated by adjusting the flow rate and velocity of the fluid 240 over the device under test 1000 as described above. Since the fluid 240 is in direct contact with the device under test 1000, the thermal resistance can be more finely controlled. Specifically, by adjusting the gap g, the temperature can be controlled through convective and conductive effects due to the flow rate. As such, variations in the gap g affect both the static thermal resistance of the fluid 240 at the device under test 1000 and the amount of heat connected away due to the flow rate, both of which affect the temperature (through cooling or heating) of the device under test 1000.

The controller 50 shown in FIGS. 2 and 3 can be any type of controller known in the art. Specifically the controller 50 can be implemented mechanically, using firmware, or using a general or special purpose computer implementing software stored on any recordable medium. The controller 50 stores settings and/or variables used to control the temperature. These settings and/or variables include, among others, the necessary gap g to achieve a given temperature, the current or power supplied to the heating block 20 to achieve a given temperature, and the settings for the pump 300 and valves 330, 340 to achieve a fluid flow across the device under test 1000 to achieve a given temperature. Additionally, where the heater block 20 is shaped to partially block the inlet 210 or outlet 220 as a function of the gap g, the variables can also include settings of the actuator 30 which uses the heater block 20 to further obstruct the openings 210, 220 to achieve a desired temperature. As is evident to those skilled in the art, such settings and/or variables can be determined using empirical or other modeling techniques known in the art.

It should be noted that the shown embodiment in FIG. 3 has a controllable passage way between the inlet 210 and the outlet 220 due to the movement of the heating block 20. However, it is understood that this feature need not be included, and that other types of variable passageways could be provided which more finely control the passageway shape independent of the movement of the heater block 20. For instance, the shape could be controlled using suitable tilt mechanisms to tilt the heating block 20 to compensate to change the fluid 240 temperature as the fluid 240 flows across the device under test 1000.

Figure 4:
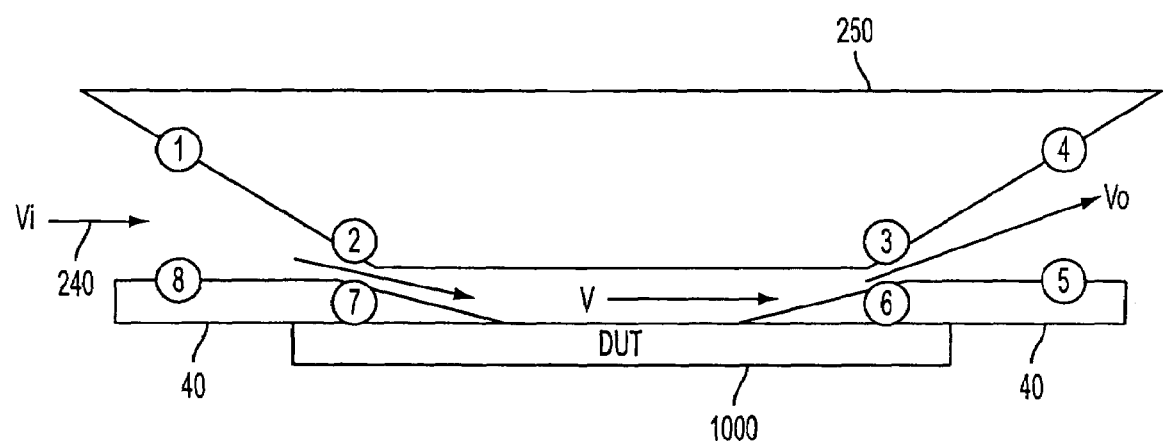
FIG. 4 is a further embodiment of the module shown in FIG. 3 in which the module holds the device under test.

According to a further embodiment of the invention the fluid 240 is a gas suitable for cooling. Specifically, the fluid 240 could be cooled air, compressed or liquid nitrogen, or any other gaseous mixture suitable for cooling. When the device under test 1000 is placed on a contact or a tester (not shown), the fluid 240 is accelerated past the device under test 1000. As shown in FIG. 4, the passageway height is narrowest between points 2 and 7 and 3 and 6 so as to accelerate the flow to a gap flow rate of V from an initial flow rate Vi at points 1 and 8. Additionally, the gap flow rate V decelerates at points 4 and 5 to an exit flow rate Vo. This acceleration of the fluid 240 across the device under test 1000 improves and mechanically controls the cooling effects at the device under test 1000.

As shown in FIGS. 3 and 4, an extended portion 250 extends from the heater block 20 so as to adjust a contour of the passageway. The contour is adjusted to optimize the flow of the fluid 240 across the device under test 1000. However, the extended portion 250 need not be used in all aspects of the invention, and need not be integrally attached to the heater block 20.

According to another aspect of the invention, the flow of the fluid 240 can be used to create a vacuum hold on a device under test 1000 such that the module 100 can further be used to supplement the pick and place action of the handler 200 shown in FIG. 1. In order to use the module 100 to create the vacuum, the controller 50 controls the inlet valve 340 to be closed and the outlet valve 330 to be opened. This creates a vacuum within the temperature control unit 10 so as to hold the device under test 1000 against the interface 40. Thus, as shown in FIG. 4, the interface 40 can be above the device under test 1000. As such, according to this aspect, the module 100 holds the device under test 1000 using this suction force during transport. However, it is understood that other mechanisms can be used to create the suction force, such as reversing the pump 300 and instead closing the outlet valve 330.

Additionally, while dual valves 330, 340 are shown, it is understood that only one valve could be used. In such an embodiment, the direction of the pump 300 would be controlled according to the location of the one valve at either the inlet 210, or the outlet 220 of the temperatures control unit 10.

Additionally, the module 100 is able to activate the heater block 20 to thus adjust the temperature of the device under test 1000 while being transported to the tester prior to the testing phase. Where this transport function is used, it is understood that vacuum pads (not shown) as conventionally known would be attached to the device under test 1000 to facilitate the suction effect.

During use, the device shown in FIG. 3 would operate as follows. The controller 50 would calibrate the valves 330, 340 using the valve controller 310. The calibration would be for an optimal setting to achieve a desired temperature during the testing phase. The controller 50 would also determine the necessary gap g necessary, as well as a current or power required such that the heater block 20 to achieve the desired temperature in combination with the fluid flow rate. The controller 50 then adjusts the gap g, applies the determined current to the heater block 20, and adjusts the flow rate of the fluid 240 through adjustments of the valves 330, 340 the pump 300. Once the device under test 1000 is determined to be at a desired temperature using a sensor (not shown), the tester proceeds to test the device under test 1000.

Where the module 100 was used to hold the device under test 1000, the controller 50 would create a vacuum so as to hold the device under test 1000 in position to be transported to the tester (not shown) for testing. While not required, it is understood that the heater block 20 could be controlled roughly to adjust the temperature of the device under test 1000 during transportation so as to reduce the overall testing time while at the tester. Once at the tester, the vacuum operation would be discontinued and the device under test 1000 would be set on a corresponding contactor used for the testing. Once the testing is complete, the module 100 again creates the vacuum so as to hold the device under test 1000, and removes the device under test 1000 to an exit position off of the tester.

Figure 5:
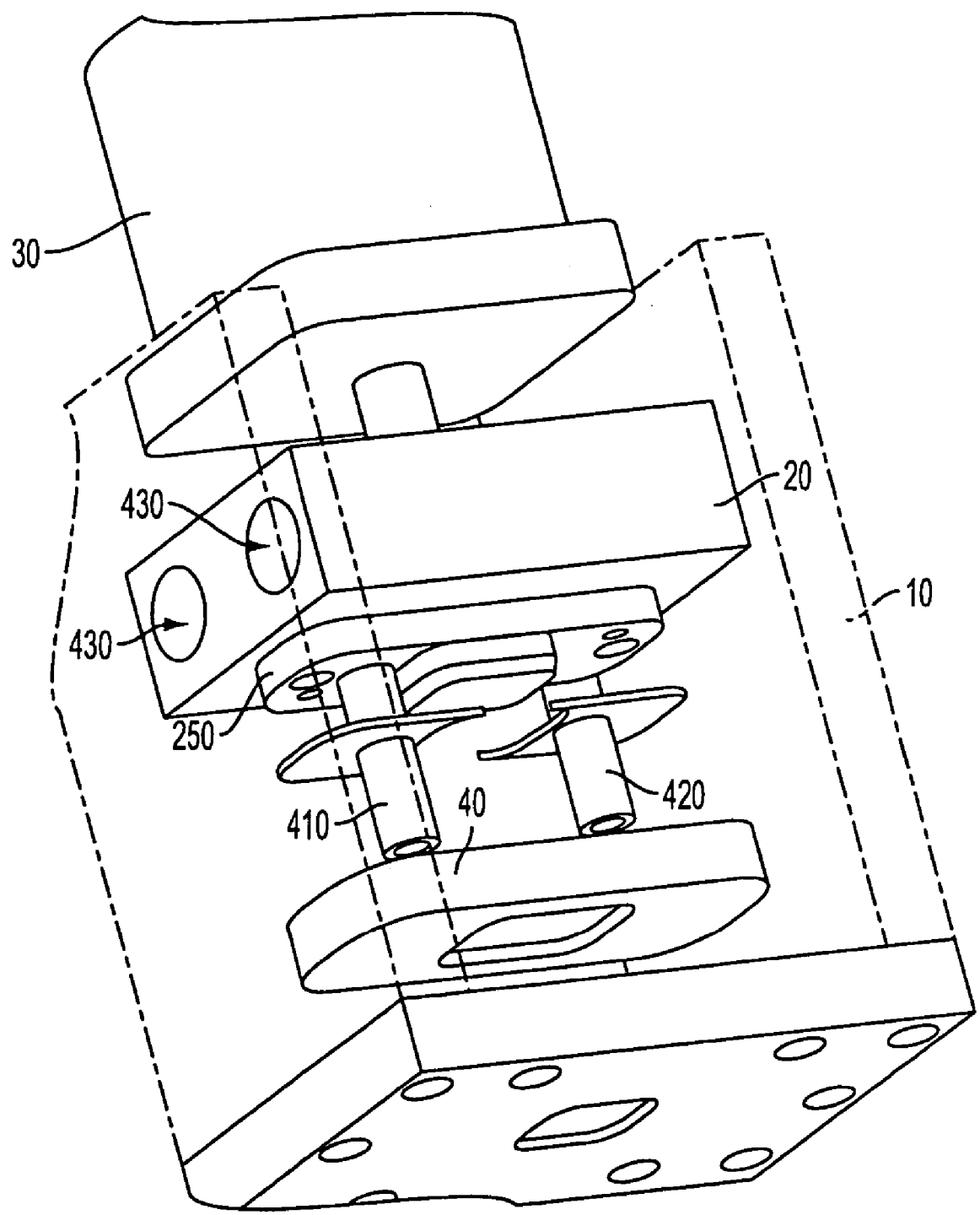
FIGS. 5 and 6 are isometric views of the interior of the micro thermal chamber in accordance with another embodiment of the invention.
Figure 6:
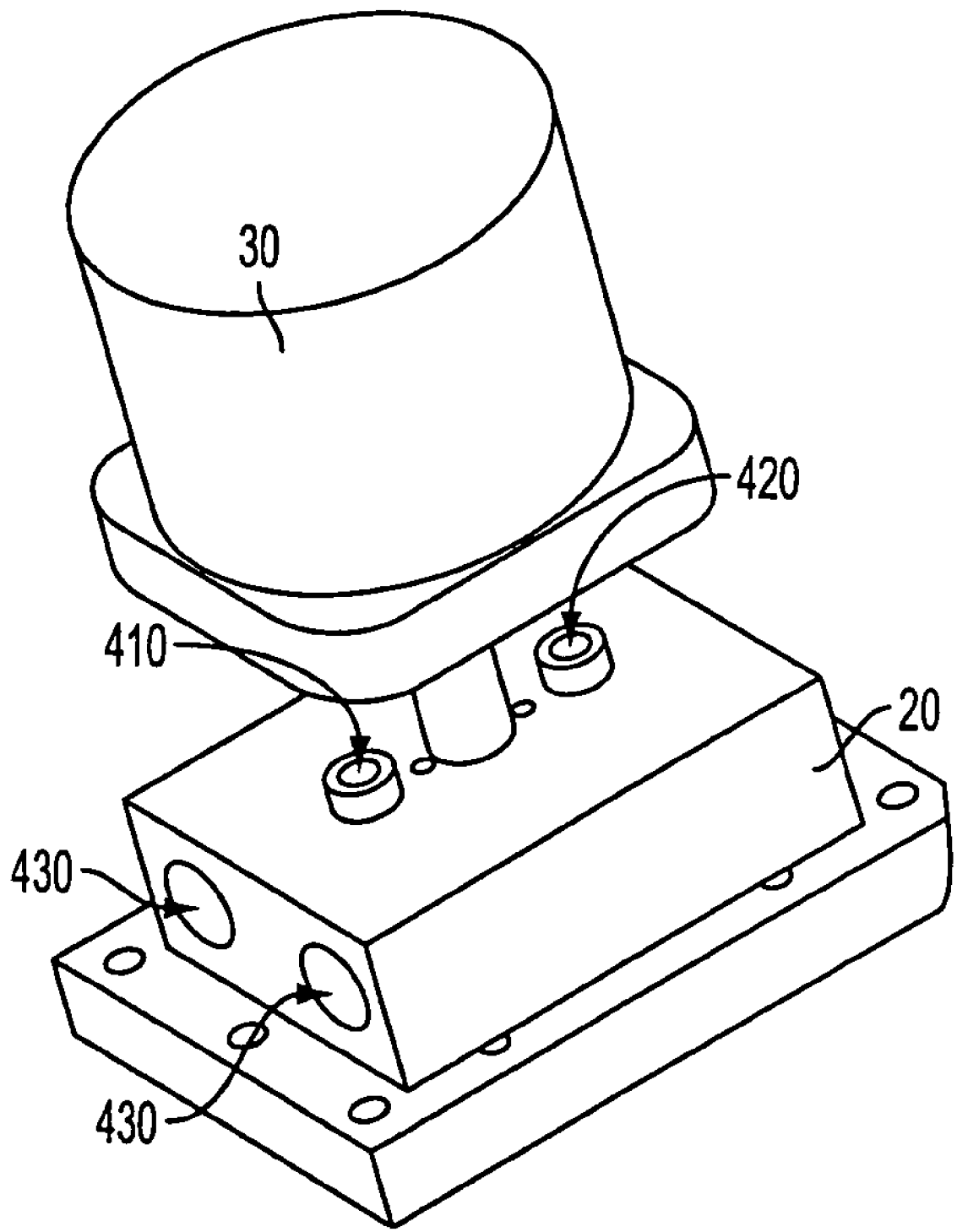

According to an additional embodiment of the invention shown in FIGS. 5 and 6, the module 100 includes a heater block 20 having an insulated inlet opening 410 and an insulated outlet opening 420. The fluid 240 flows from the inlet 210 through the inlet opening 410, and is removed from the module 100 through the outlet opening 420 to the outlet 220. Additionally, the heater block 20 includes heating element openings 430 into which separate heating elements can be inserted. Such heating elements can be cylindrical heaters or any other type of heater element. However, it is understood that the heater block 20 need not use such heater elements and can instead have the same directly incorporated into the heater block 20 design.

While the fluid 240 is described in terms of being cold air and liquid nitrogen, it is understood that the fluid 240 can be any other quickly evaporating fluid, preferably non-toxic and non-polluting. However, where a non-evaporating fluid 240 is to be used, it is understood that a flexible membrane could be used between the device under test 1000 and the heater block 20 to avoid losing the non-evaporating fluid 240. It is understood that such a membrane increases the thermal resistance so as to affect the temperature control of the module 1000 such that evaporating fluids 240 are generally preferable.

Additionally, it is understood that a non-heating block could be used instead of the heater block 20. In such an embodiment, the fluid 240 would be used to provide both heating and cooling of the device under test 1000 according to the fluid temperature and the gap g size.

According to various aspects of the present invention, a device under test can be accurately tested at a desired temperature by adjusting thermal resistance between a source, such as a heater block, and a target, such as a device under test. Further, the temperature can be more finely controlled by introducing a fluid and adjusting the flow rate by adjusting the cross sectional area of a passageway between the device under test and the heater block. In this combined system, the modification of the distance between the device under test and the heater block both varies the thermal resistance due to the distance, and due to the flow rate of the fluid traveling therebetween. In this way, the heating and cooling media come into direct contact with the device under test, which further increases the efficiency and response time. Therefore, large temperature ranges for both hot and cold can be controlled with fast response times. Additionally, by mechanically controlling the temperature using motors instead of changing the temperature of a heater element, the present invention achieves a more robust solution while allowing accurate temperature control at fast response times. Thus, the present invention provides a low cost, robust solution and further has an option to pick and place the devices being tested so as to also have the advantage of being usable to transport the device under test in addition to providing temperature control during testing.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A temperature unit to control a temperature of a device under test, comprising:
   a heater block disposed opposite the device under test and which generates heat receivable by the device under test across a gap, wherein the heater block includes an extended portion which extends from the heater block into the gap to define a contour of the gap opposite the device under test;
   an actuator which moves the heater block so as to adjust the gap while the heater block generates heat so as to vary an amount of heat received at the device under test so as to adjust the temperature of the device under test; and
   a housing which houses the actuator and the heater block and which includes an interface to hold the device under test, wherein the housing is connectable to a handler for use in automated testing equipment.

2. The temperature unit of claim 1, wherein:
   the actuator increases the gap so as to increase a thermal resistance between the heater block and the device under test so as to decrease the amount of the heat received at the device under test, and
   the actuator decreases the gap so as to decrease the thermal resistance between the heater block and the device under test so as to increase the amount of the heat received at the device under test.

3. The temperature unit of claim 2, further comprising a medium disposed in the gap and which has the thermal resistance.

4. The temperature unit of claim 1, wherein the actuator further comprises a screw turnable by the actuator to adjust the gap between the heater block and the device under test.

5. The temperature unit of claim 1, further comprising a controller which controls the actuator and the heater block, wherein the controller includes information regarding heater block and actuator settings used to achieve a variety of temperatures of the device under test.

6. A temperature unit to control a temperature of a device under test using a fluid, comprising:
   a block disposed opposite the device under test and which defines a passageway therebetween and through which the fluid passes over the device under test at a gap flow rate, wherein the block includes an extended portion which extends from the block into the passageway to define a contour of the passageway opposite the device under test; and
   an actuator which moves the block so as to adjust the passageway and vary the gap flow rate of the fluid flowing over the device under test so as to adjust the temperature of the device under test.

7. The temperature unit of claim 6, wherein the block comprises a heater block which generates heat receivable by the device under test across the passageway.

8. The temperature unit of claim 6, further comprising:
a valve which controls an initial flow rate of the fluid introduced into the passageway,
wherein the actuator adjusts the passageway so as to vary the gap flow rate from the initial flow rate.

9. The temperature unit of claim 6, further comprising:
a pump which controls an initial flow rate of the fluid introduced into the passageway,
wherein the actuator adjusts the passageway so as to vary the gap flow rate from the initial flow rate.

10. The temperature unit of claim 9, further comprising a valve through which the fluid passes between the passageway and the pump.

11. The temperature unit of claim 10, wherein the valve is closed in order to create a suction force at the passageway using the pump sufficient to hold a weight of the device under test.

12. The temperature unit of claim 11, wherein the block comprises a heater block which generates heat receivable by the device under test across the passageway.

13. The temperature unit of claim 12, wherein, while the suction force is created, the heater block generates the heat so as to adjust the temperature of the device under test.

14. The temperature unit of claim 6, further comprising a controller which controls the actuator, wherein the controller includes information regarding actuator settings used to adjust the gap flow rate to achieve a variety of temperatures of the device under test.

15. The temperature unit of claim 7, further comprising a controller which controls the actuator and the heater block, wherein the controller includes information regarding heater block and actuator settings used to achieve a variety of temperatures of the device under test.

16. The temperature unit of claim 10, further comprising a controller which controls the actuator, the pump, the heater block, and the valve, wherein the controller includes information regarding actuator, pump, heater block, and valve settings used to achieve a variety of temperatures of the device under test.

17. The temperature unit of claim 16, wherein the controller further includes information regarding actuator, pump, heater block, and valve settings used to create a suction force at the passageway sufficient to hold a weight of the device under test.

18. The temperature unit of claim 6, wherein the extended portion is detachable from the block.

19. A computer readable medium encoded with processing instructions for implementing a method of controlling a temperature of a device under test performed by a computer, the method comprising:
determining actuator and heater block settings required to achieve a required temperature for the device under test;
adjusting a heater block to generate heat according to the determined heater block setting;
adjusting the actuator to move the heater block to define a passageway above the device under test according to the determined actuator setting, through which a fluid passes over the device under test; and
extending an extendable portion of the heater block into the passageway to define a contour of the passageway.

20. The computer readable medium of claim 19, the method further comprising detecting a present temperature of the device under test and adjusting one of the heater block and the actuator if the present temperature is not the required temperature.

21. The computer readable medium of claim 19, wherein the determining the actuator and heater block settings comprises detecting a present temperature of the device under test and determining the heater block and the actuator settings if the present temperature is not the required temperature.

22. A computer readable medium encoded with processing instructions for implementing a method of controlling a temperature of a device under test within a temperature unit as performed by a computer, the method comprising:
for an initial flow rate of fluid introduced into the temperature unit, determining an actuator setting required to achieve a required temperature for the device under test;
adjusting the actuator to move a block to form a passageway above the device under test according to the determined actuator setting so as to vary the initial flow rate to achieve a gap flow rate of the fluid flowing across the device under test which achieves the required temperature; and
extending an extendable portion of the block into the passageway to define a contour of the passageway.

23. The computer readable medium of claim 22, wherein the block comprises a heater block which generates heat receivable by the device under test across the passageway, the method further comprising:
determining a heater block setting required to achieve the temperature required for the device under test in conjunction with the determined actuator setting; and
adjusting the heater block to generate the heat according to the determined heater block setting.

24. The computer readable medium of claim 23, the method further comprising detecting a present temperature of the device under test and adjusting one of the heater block and the actuator if the present temperature is not the required temperature.

25. The computer readable medium of claim 23, wherein the determining the actuator and heater block settings comprises detecting a present temperature of the device under test and determining the heater block and the actuator settings if the present temperature is not the required temperature.

26. The computer readable medium of claim 22, the method further comprising creating a suction force within the passageway by adjusting a valve through which the fluid is introduced into the temperature unit and controlling a pump which circulates the fluid through the temperature unit.

* * * * *